(12) United States Patent
Iida

(10) Patent No.: US 8,065,589 B2
(45) Date of Patent: Nov. 22, 2011

(54) SEMICONDUCTOR MEMORY DEVICE

(75) Inventor: Masahisa Iida, Osaka (JP)

(73) Assignee: Panasonic Corporation, Osaka (JP)

( * ) Notice: Subject to any disclaimer, the term of this patent is extended or adjusted under 35 U.S.C. 154(b) by 417 days.

(21) Appl. No.: 12/207,870

(22) Filed: Sep. 10, 2008

(65) Prior Publication Data
US 2009/0094493 A1 Apr. 9, 2009

(30) Foreign Application Priority Data

Oct. 4, 2007 (JP) ................................ 2007-260850

(51) Int. Cl.
*G11C 29/00* (2006.01)
(52) U.S. Cl. ....................... 714/763; 714/764; 365/200
(58) Field of Classification Search ........................ None
See application file for complete search history.

(56) References Cited

U.S. PATENT DOCUMENTS

| | | | | |
|---|---|---|---|---|
| 3,944,800 A * | 3/1976 | Beck et al. | ............... | 714/820 |
| 4,672,614 A * | 6/1987 | Yoshida | ................... | 714/764 |
| 5,142,541 A * | 8/1992 | Kim et al. | ............... | 714/764 |
| 5,359,722 A | 10/1994 | Chan et al. | | |
| 5,555,250 A * | 9/1996 | Walker et al. | ............. | 714/763 |
| 5,923,682 A * | 7/1999 | Seyyedy | ................. | 714/773 |
| 5,926,420 A * | 7/1999 | Kim | ..................... | 365/189.02 |
| 6,233,717 B1 * | 5/2001 | Choi | ..................... | 714/805 |
| 6,449,204 B1 * | 9/2002 | Arimoto et al. | .......... | 365/222 |
| 6,678,860 B1 | 1/2004 | Lee | | |
| 6,697,285 B2 * | 2/2004 | Iwase | ................... | 365/189.05 |
| 7,353,438 B2 * | 4/2008 | Leung et al. | ............. | 714/720 |
| 7,458,004 B2 | 11/2008 | Takahashi | | |
| 7,464,320 B2 * | 12/2008 | Nagai et al. | ............. | 714/763 |
| 7,610,542 B2 | 10/2009 | Nagai | | |
| 2004/0004866 A1 | 1/2004 | Hidaka | | |
| 2005/0005230 A1 | 1/2005 | Konga et al. | | |
| 2006/0112321 A1 | 5/2006 | Leung | | |
| 2006/0156196 A1 | 7/2006 | Takahashi et al. | | |

(Continued)

FOREIGN PATENT DOCUMENTS

JP 59-218556 12/1984

(Continued)

OTHER PUBLICATIONS

Japanese Notice of Reasons for Rejection, w/ English translation thereof, issued in Japanese Patent Application No. JP 2007-260850 dated Feb. 1, 2011.

*Primary Examiner* — Jeffrey A Gaffin
*Assistant Examiner* — Steve Nguyen
(74) *Attorney, Agent, or Firm* — McDermott Will & Emery LLP

(57) ABSTRACT

A semiconductor memory device includes a memory cell array from which all bits of a data signal having a first number of the bits composed of a main data signal and an error detection/correction code data signal are simultaneously read, a sense amplifier for amplifying the read data signal, a selection unit for selecting a data signal having a second number of bits forming a part of the data signal amplified by the sense amplifier, and an error detection/correction unit for performing error detection and correction based on at least a part of the selected data signal having the second number of bits, wherein the selection by the selection unit is performed based on a row address.

14 Claims, 6 Drawing Sheets

U.S. PATENT DOCUMENTS

| | | |
|---|---|---|
| 2006/0200728 A1 | 9/2006 | Nagai et al. |
| 2007/0208968 A1* | 9/2007 | Krishnamurthy et al. .... 714/718 |
| 2008/0082899 A1* | 4/2008 | Muhammad et al. ......... 714/763 |

FOREIGN PATENT DOCUMENTS

| | | |
|---|---|---|
| JP | 62-214599 | 9/1987 |
| JP | 01-239656 | 9/1989 |
| JP | 5-33252 | 4/1993 |
| JP | 11-312396 | 11/1999 |
| JP | 2001-84792 | 3/2001 |
| JP | 2003-059290 | 2/2003 |
| JP | 2005-327437 | 11/2005 |
| JP | 2007-141372 | 6/2007 |
| JP | 2007-242162 | 9/2007 |

* cited by examiner

SEMICONDUCTOR MEMORY DEVICE

BACKGROUND OF THE INVENTION

1. Field of the Invention

The present invention relates to a semiconductor memory device including an ECC (Error Checking and Correcting) circuit.

2. Description of the Prior Art

In recent years, higher integration for implementing a SOC (System On Chip) at a low cost has been particularly required of an embedded DRAM (Dynamic Random Access Memory). Since a memory array portion occupies a majority of a memory area, the area of each memory cell has been reduced by means of a technology for miniaturizing a memory cell transistor and a memory capacitor using a high-dielectric-constant insulating film in order to implement higher integration.

When a stacked memory cell is miniaturized, the surface area of a capacitor is accordingly reduced so that a sufficient capacitance is ensured for the capacitor by introducing a novel high-dielectric-constant insulating film. However, to increase the capacitance of the capacitor, the thickness of the insulating film should be minimized, which increases a tunnel leakage current in the capacitor insulating film. In addition, because of a strong demand for logic compatibility in the miniaturization process mentioned above, a storage node has been silicidized, which increases a junction leakage in the storage node. As a result, the deterioration of the charge retention time of a cell has presented a problem. In addition, there has also been a requirement for provision against degraded reliability resulting from the reduced charge retention time of a cell, an increased cell access time, each due to post-fabrication variations with time in the characteristics of a cell capacitor and a cell transistor, or the like. It is known that, to improve the degraded reliability of a cell, a method using ECC is useful.

As an example of a known technology related to a semiconductor memory device including an ECC circuit, the specification of US Patent Application Publication No. 2006/0112321 discloses a sequence method wherein, to implement an error correcting operation with a byte write function, a word line and a sense amplifier are continuously activated in a serial sequence which performs a data read operation, and a write back operation of writing, back to a memory cell, replaced data obtained by replacing a part of error corrected data with external data as well as parity data generated from the replaced data.

In Japanese Laid-Open Patent Publication No. 2003-59290, a structure is shown which replaces m bits forming a part of n-bit error corrected read data with external input data, and performs a write back operation in order to implement an error correcting operation with a byte write function.

Further, in Japanese Laid-Open Patent Publication No. 2005-25827, a structure is shown which performs a read-modify-write operation in order to implement an ECC operation with a byte mask function in an SDRAM (Synchronous DRAM). The structure allows midway interruption of the inputting of burst data by completing syndrome generation and error correction during read latency, preparing error corrected read data during read latency, and performing parity generation and a write back operation in each burst cycle after a lapse of read latency.

In Japanese Laid-Open Patent Publication No. 2006-244632, a structure is shown which performs a pipeline read-modify-write operation in order to implement an ECC operation with a byte mask function in an SDRAM. To prevent a data collision in a bus during a read operation prior to a write operation and during a write back operation of writing back data and parity data, the structure divides DQ lines into those for a read operation and those for a write operation. Alternatively, the structure separately performs a read operation and a write operation in an even-numbered cycle and an odd-numbered cycle of a burst operation.

In the case where stored data is read in each of the semiconductor memory devices, a multiple bit signal is read first from a memory cell array in accordance with a row address, and amplified and held by a sense amplifier (RAS (Row Address Strobe) Cycle)). Thereafter, a signal composed of some of the foregoing plurality of bits selected therefrom in accordance with a column address in a column gate is inputted to an ECC circuit via a buffer, subjected to error detection and correction, and outputted as read data from the semiconductor memory device (CAS (Column Address Strobe) cycle).

However, in the case where some of a plurality of bits read from a memory cell array are selected in accordance with a column address as described above, the foregoing selection, error detection and correction, and the like are performed after the column address is determined. This leads to the problem that it is difficult to reduce CAS access time and, therefore, it is also difficult to increase the speed of a memory access.

SUMMARY OF THE INVENTION

The present invention has been achieved in view of the foregoing circumstances, and an object of the present invention is to implement a memory with an ECC function which can easily increase a data transfer efficiency by reducing CAS access time.

To achieve the problems mentioned above, a semiconductor memory device according to a first embodiment of the present invention includes: a memory cell array from which all bits of a data signal having a first number of the bits composed of a main data signal and an error detection/correction code data signal are simultaneously read; a sense amplifier for amplifying the read data signal; a selection unit for selecting a data signal having a second number of bits forming a part of the data signal amplified by the sense amplifier; and an error detection/correction unit for performing error detection and correction based on at least a part of the selected data signal having the second number of bits, wherein the selection by the selection unit is performed based on a row address.

In the arrangement, the selection of the part of the data signal amplified by the sense amplifier allows a reduction in the scale of the subsequent processing circuit. In addition, since the foregoing selection is performed based on the row address, a process such as the selection itself, or the selection itself and the subsequent error detection and correction can be performed even when the column address is not determined. This allows a reduction in CAS access time or the like.

A device according to a second embodiment of the present invention is the semiconductor memory device according to the first embodiment, and further includes: an amplification unit for amplifying the data signal having the second number of bits selected by the selection unit; and an amplified data signal selection unit for selecting a data signal having a third number of bits forming a part of the amplified signal having the second number of bits, wherein the selection by the amplified data signal selection unit is performed based on either one of the row address and a column address.

The arrangement easily allows an increase in the ratio between the number of bits in an access to the memory cell array and the number of bits in error detection and correction so that the optimization of an error correction process time and a circuit area becomes easy. In the case where the selection by the amplification data signal selection unit is also performed based on the row address, a process such as the subsequent error detection and correction can also be performed promptly.

A device according to a third embodiment of the present invention is the semiconductor memory device according to the second embodiment, and further includes: a holding unit for holding the data signal before or after the amplification by the amplification unit; or a holding unit serving also as the amplification unit.

The arrangement allows a read or write operation to the same row address to be promptly performed with respect to the data held by the holding unit without involving repeated reading from the memory cell array, repeated amplification by the sense amplifier, or the like. When the holding unit serves also as the amplification unit, a layout area can be easily reduced.

A device according to a fourth embodiment of the present invention is the semiconductor memory device according to the third embodiment, and further includes a switch for cutting off the holding unit and the selection unit.

In the arrangement, when the switch is brought into the cut-off state, the influence of a parasitic capacitance is reduced to easily increase the speed of the amplifying operation by the amplification unit. Moreover, since the accumulation and release of charges with respect to the parasitic capacitance is reduced, power consumption is reduced.

A device according to a fifth embodiment of the present invention is the semiconductor memory device according to the fourth embodiment, wherein a replaced data signal obtained by replacing a part of the corrected data signal from the error detection/correction unit with a part of a data signal inputted from an outside of the semiconductor memory device is written in the memory cell array via the selection unit, and the replaced data signal is held by the holding unit via the switch.

In the arrangement, when a part of stored data is rewritten, the data held by the holding unit is updated. Accordingly, a read and/or write operation to the same row address after a rewrite operation as described above, i.e., a read access, a write access, and the like in various orders during, e.g., a page operation can also be performed properly and promptly.

A device according to a sixth embodiment of the present invention is the semiconductor memory device according to the fifth embodiment, wherein the data signal outputted from the holding unit is cut off when the replaced data signal is written in the memory cell array.

In the arrangement, even when the replaced data signal to be written in the memory cell array is held by the holding unit, the problem is prevented that the replaced data signal is overwritten by the data signal held thereby to result in the occurrence of racing or the like.

A device according to a seventh embodiment of the present invention is the semiconductor memory device according to the fifth embodiment, and further includes: an input/output data signal holding unit for holding a data signal inputted and outputted between the semiconductor memory device and the outside thereof, and a replacement/selection unit for causing the input/output data signal holding unit to selectively hold a part of the corrected data signal and a part of the input data signal inputted from the outside of the semiconductor device.

A device according to an eighth embodiment of the present invention is the semiconductor memory device according to the seventh embodiment, wherein the replacement/selection unit is controlled based on a mask signal indicating the selection of the part of the corrected data signal or the part of the input data signal, and on a hold permission signal indicating permission to hold the selected data signal to the input/output data signal holding unit.

The arrangement allows easy control of the presence or absence of replacement and/or the position of data to be replaced, and also allows, e.g., a byte write operation, a bit write operation, or the like to be performed.

A device according to a ninth embodiment of the present invention is the semiconductor memory device according to the eighth embodiment, wherein the hold permission signal indicates the permission to hold the selected data signal with timing after the corrected data signal is determined.

The arrangement prevents the occurrence of useless inversion during the determination of the corrected data signal to prevent an increase in power consumption.

A device according to a tenth embodiment of the present invention is the semiconductor memory device according to the eighth embodiment, wherein the hold permission signal indicates prohibition of the holding when the data signal held by the input/output signal holding unit is written in the memory cell array.

In the arrangement, even when the data signal held by the input/output data signal holding unit, and written in the memory cell array is re-transmitted to the input/output data signal holding unit via the holding unit, the problem is prevented that the data signal held by the input/output data signal holding unit is overwritten by the data signal re-transmitted thereto to cause racing or the like.

A device according to an eleventh embodiment of the present invention is the semiconductor memory device according to the seventh embodiment, wherein a number of bits of the data signal held by the input/output data signal holding unit is equal to a number of bits of the data signal error detected and corrected by the error detection/correction unit, and different from a number of bits of the data signal inputted and outputted between the semiconductor memory device and the outside thereof, the semiconductor memory device further including: a switching circuit for mutual conversion between the number of bits of the data signal held by the input/output data signal holding unit and the number of bits of the data signal inputted and outputted between the semiconductor memory device and the outside thereof.

A semiconductor memory device according to a twelfth embodiment of the present invention includes: a memory cell array from which all bits a data signal having a first number of the bits composed of a main data signal and an error detection/correction code data signal are simultaneously read; a sense amplifier for amplifying the read data signal; an error detection/correction unit for performing error detection and correction based on the amplified data signal; and an input/output data signal holding unit for holding a data signal inputted and outputted between the semiconductor memory device and an outside thereof, wherein a number of bits of the data signal held by the input/output data signal holding unit is equal to a number of bits of a data signal error detected and corrected by the error detection/correction unit, and different from a number of bits of the data signal inputted/outputted between the semiconductor memory device and the outside thereof, the semiconductor memory device further including: a switching circuit for mutual conversion between the number of bits of the data signal held by the input/output data signal holding unit and the number of bits of the data signal inputted and outputted between the semiconductor memory device and the outside thereof.

In the arrangement, even when there is a difference between the width of a bus for data read from the memory cell and the width of an external input/output bus, it is possible to arbitrarily adjust the number of input bits to the error detection/correction circuit, and easily optimize the error correction process time and the circuit area.

DESCRIPTION OF THE PREFERRED EMBODIMENTS

Figure 1:
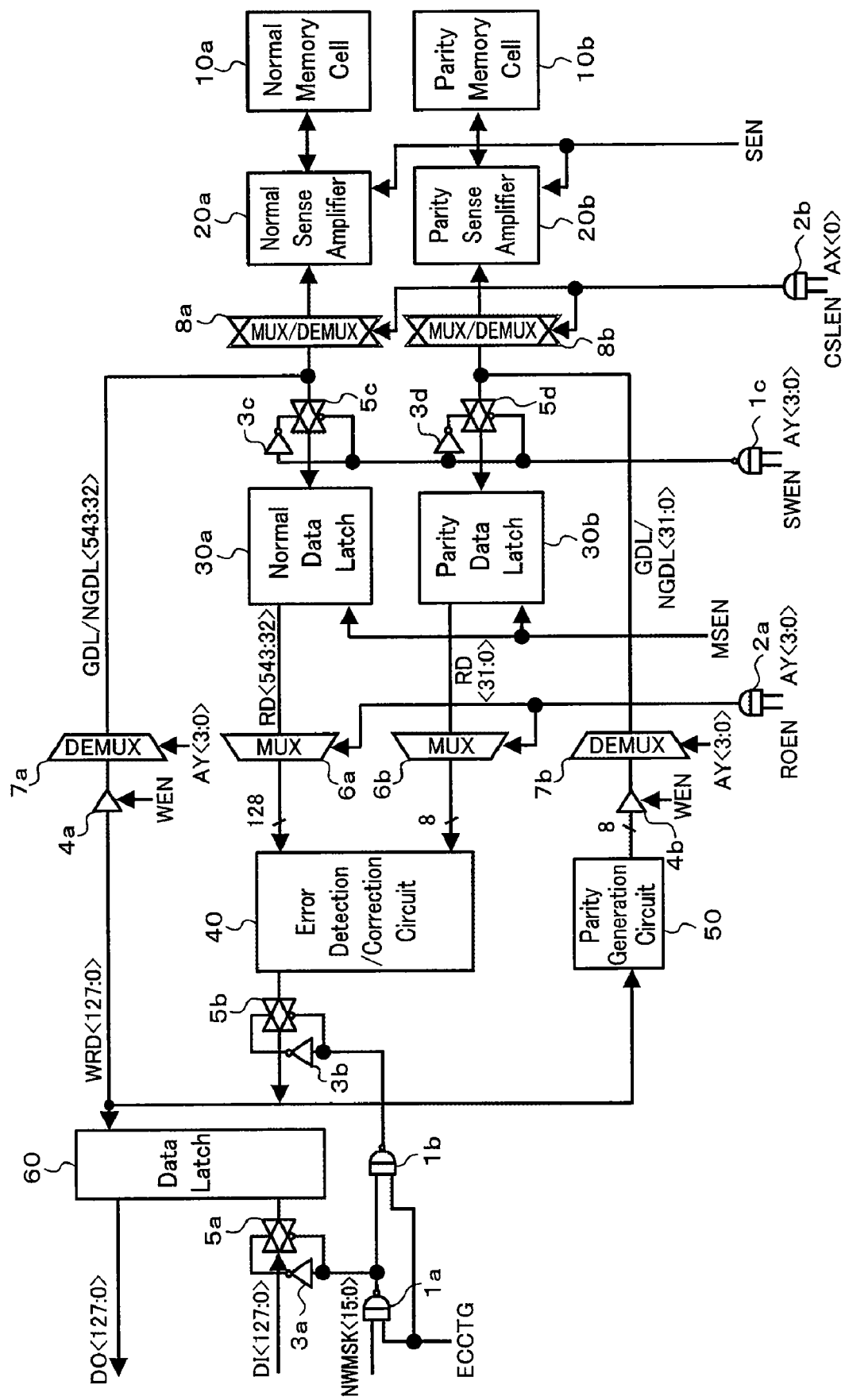
FIG. 1 is a block diagram showing a structure of a principal portion of a semiconductor memory device according to a first embodiment of the present invention.

Referring to the drawings, the embodiments of the present invention will be described hereinbelow in detail. In each of the following embodiments, a description of components having the same functions as in the other embodiments will be omitted by providing the components with the same reference numerals.

Embodiment 1

(Structure of Semiconductor Memory Device)

FIG. 1 shows a structure of a principal portion of a semiconductor memory device which is, e.g., a DRAM according to the first embodiment of the present invention. In the drawing, 1a to 1c denote NAND elements, 2a to 2b denote AND elements, 3a to 3d denote inverter elements, 4a and 4b denote tri-state elements, 5a to 5d denote transfer gates, 6a and 6b denote multiplexers, 7a and 7b denote demultiplexers, 8a and 8b denote multiplexers/demultiplexers, 10a and 10b respectively denote a memory cell for normal data and a memory cell for parity data, 20a and 20b respectively denote a sense amplifier for normal data and a sense amplifier for parity data, 30a and 30b respectively denote a data amplifier & 1st latch for normal data (normal data latch) and a data amplifier & 1st latch for parity data (parity data latch), 40 denotes an error detection/correction circuit, 50 denotes a parity generation circuit, and 60 denotes a 2nd latch (data latch).

Figure 2:
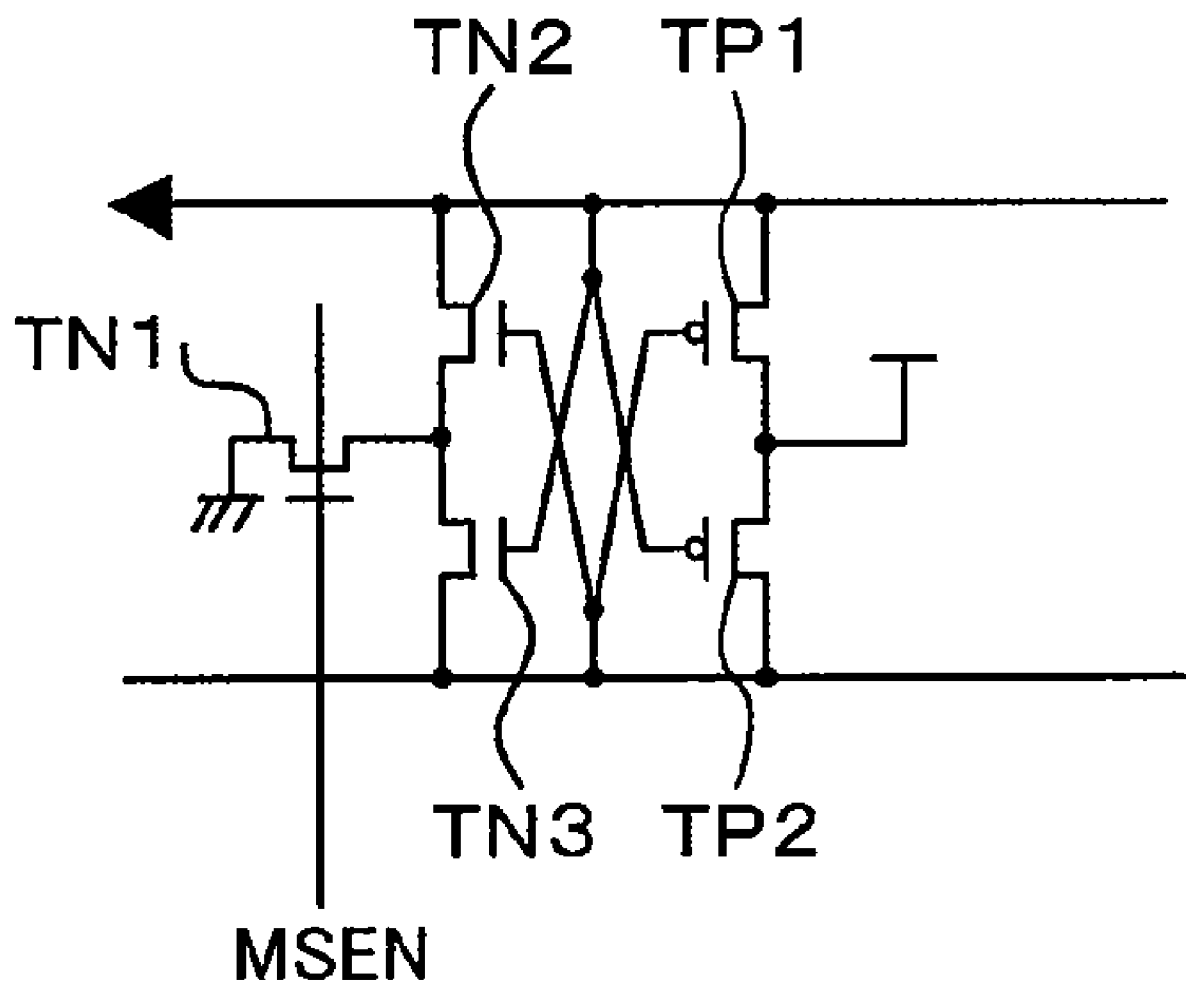
FIG. 2 is a circuit diagram showing a structure of a data amplifier & 1st latch 30 in the semiconductor memory device according to the first embodiment.

Specifically, each of the data amplifiers & latches 30a and 30b has a structure as shown in, e.g., FIG. 2. In the drawing, TN1 to TN3 denote NMOS (N-channel Metal-Oxide Semiconductor) transistors, and TP1 and TP2 denote PMOS transistors. The structure is a cross-coupling latch amplifier. When a data amplifier & 1st latch control signal MSEN is brought to a H (High) level, the cross-coupling latch amplifier amplifies the potential between a pair of input signal lines, and outputs a signal on a logic level (H or L (Low) level), and retains the level. That is, the structure allows easy minimization of a layout area by functioning as both a data amplifier and a latch.

In the drawing, GDL/NGDL<543:0> (GDL/NGDL<543:32> and GDL/NGDL<31:0>) denote global data lines, RD<543:0> (RD<543:32> and RD<31:0>) denote first latch nodes as outputs of the data amplifiers & 1st latches 30a and 30b, WRD<127:0> denotes a 2nd latch node as an output of the 2nd latch 60, and DI/DO<127:0> denote input/output data buses. The multiplexers/demultiplexers 8a and 8b, the memory cells 10a and 10b, and the sense amplifiers 20a and 20b are connected to each other via 1024 or 64 bit lines (cell access bit lines) so that 1024-bit normal data and 64-bit parity data are simultaneously read or written.

On the other hand, SEN denotes a sense amplifier control signal, CSLEN denotes a sense amplifier/global data line connection control signal, SWEN denotes a 1st latch input control signal, MSEN denotes the data amplifier & 1st latch control signal, ROEN denotes a 1st latch data output control signal, ECCTG denotes a 2nd latch transfer control signal, WEN denotes a write buffer control signal, AX<0> denotes a row predecode signal, AY<3:0> denotes a column predecode signal, and NWMSK<15:0> denotes a write mask signal.

In the semiconductor memory device, 128-bit data is inputted and outputted between the device and an external circuit via input/output data buses DI/DO<127:0>, and 8-bit parity data is added to the 128-bit data so that an ECC process is performed. The semiconductor memory device further has a write mask function to be capable of rewriting, of the 128-bit input data, only data specified by the write mask signal NWMSK<15:0> in units of, e.g., one byte, one bit, a predetermined numbers of bits, or the like.

The semiconductor memory device is also constructed to be capable to a page operation of which one cycle is complete in two or more clocks.

(Operation of Semiconductor Memory Device)

Figure 3:
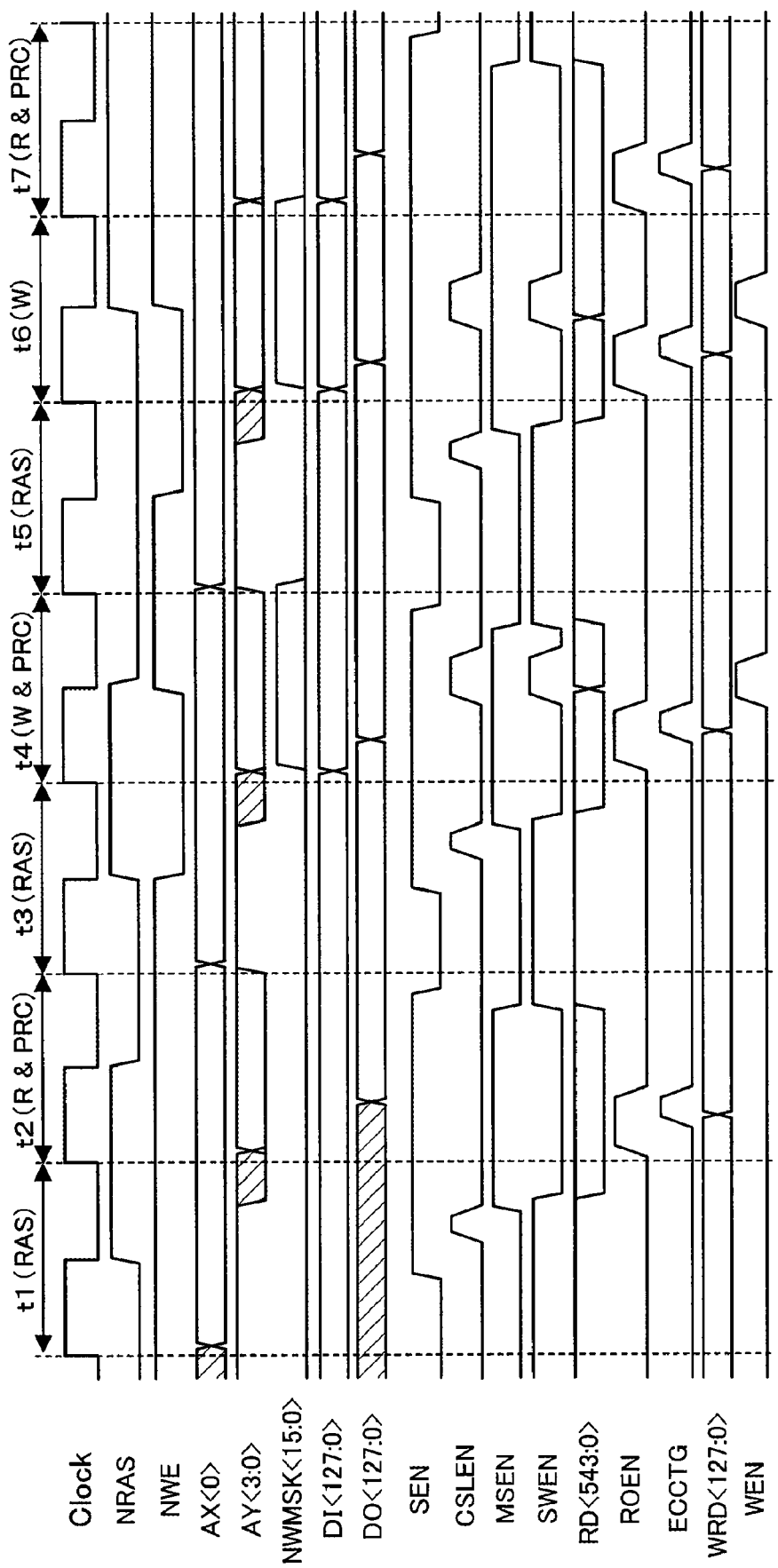
FIG. 3 is a timing diagram showing an operation of the semiconductor memory device according to the first embodiment.

An operation of a circuit thus constructed will be described with reference to a timing diagram of FIG. 3.

(Random Read Operation)

Periods t1 and t2 show an example of a random read operation. A control unit not shown controls the individual components to perform a RAS operation (RAS cycle) in the period t1 by sensing a shift of a signal NRAS to the L level on a rising edge of a clock (RAS command), and perform a read operation and a precharge operation (CAS cycle) in the period t2 in the second clock on sensing the H level of a signal NWE and the H level of the signal NRAS.

First, in the RAS cycle t1, a word line not shown is enabled (brought to an active level) when a RAS command is sensed so that memory cell data (1024-bit normal data and 64-bit parity data) is read from the memory cell 10 onto bit lines and, subsequently, the sense amplifier control signal SEN is enabled to operate the sense amplifier 20.

Thereafter, the sense amplifier/global data line connection control signal CSLEN shifts to the H level so that the multiplexers/demultiplexers 8 select (512+32) bit lines from among (1024+64) bit lines in response to the row predecode signal AX<0> that has been determined when the RAS command is sensed, and connect the selected bit lines to the global data lines GDL/NGDL<543:0>. At this time, the 1st latch input control signal SWEN and the column predecode signal AY<3:0> are further brought to the H level so that the transfer gates 5 are brought into a conductive state. In response to this, data on the selected bit lines is inputted to the data amplifiers & 1st latches 30 via the global data lines. At this time point, however, the potentials of signals inputted to the global data lines and the data amplifiers & 1st latches 30 change only slightly because the wiring capacitances (parasitic capacitances) of the global data lines are normally large.

Then, when the data amplifier & 1st latch control signal MSEN is brought to the H level, data in the data amplifiers & 1st latches 30 begins to be amplified. When the 1st latch input control signal SWEN is further brought to the L level and the large parasitic capacitances of the global data lines are separated, the potentials at the 1st latch nodes RD<543:0> are rapidly amplified so that data is determined (By thus separating the 1st latch nodes RD<543:0> and the global data lines as described above, the global data lines are each prevented from being needlessly amplified to a full amplitude so that a power reduction is easily achieved).

In the next CAS cycle t2, the 1st latch data output control signal ROEN shifts to the H level so that the multiplexers 6 select (128+8) bits of the (512+32)-bit data in the 1st latch nodes RD<543:0> that has been outputted from the foregoing data amplifiers & 1st latches 30 in response to the column predecode signal AY<3:0> that has been determined on sensing the CAS cycle, and inputs the selected (128+8) bits corresponding to ¼ of the (512+32)-bit data as normal read data and parity read data to the error detection/correction circuit 40. The error detection/correction circuit 40 outputs the 128-bit error corrected data.

Thereafter, when the 2nd latch transfer control signal ECCTG shifts to the H level with the timing of the completion of the error correction described above, the write mask signal NWMSK<15:0> is controlled to the L level in a read cycle, so that all the error corrected data is latched by the 2nd latch 60, and outputted to the read output bus DO<127:0> (By thus bringing the 2nd latch transfer control signal ECCTG to the H level after the determination of all the data from the error correction circuit as described above, unnecessary inversion of the 2nd data latch node WRD<127:0> can be prevented, and a power reduction is achieved).

Further, after a serial read sequence is complete, the global data lines and the bit lines are precharged by a precharge circuit not shown.

By thus reducing the number of bits to one half through the selection performed in accordance with the row predecode signal AX<0>, the circuit scale of the data amplifier & 1st latch 30 can be reduced, and an amplifying operation can be performed in the RAS cycle. Accordingly, the time required for the CAS cycle can easily be reduced irrespective of error detection/correction.

(Random Write Operation)

Periods t3 and t4 show an example of a random write operation. The control unit controls the individual components to perform a RAS operation (RAS cycle) in the period t3 by sensing a shift of the signal NRAS to the L level on a rising edge of the clock (RAS command), and perform a write operation and a precharge operation (CAS cycle) in the period t4 in the second clock on sensing the L level of the signal NWE and the H level of the signal NRAS.

In the case where the semiconductor memory device has an error correcting function and a byte write function, the write operation requires a read-modify-write sequence. Accordingly, the operation in the RAS cycle t3 becomes the same as that in the RAS cycle t1 of the random read operation described above.

In the next CAS cycle t4, the same operation as the random read operation is also performed initially. That is, the 1st latch data output control signal ROEN shifts to the H level so that the multiplexers 6 select (128+8) bits of the data in the 1st latch nodes RD<543:0) in response to the column predecode signal AY<3:0>, and inputs the selected (128+8) bits corresponding to ¼ of the data in the 1st latch nodes RD<543:0) as the normal read data and the parity read data to the error detection/correction circuit 40. The error detection/correction circuit 40 outputs the 128-bit error corrected data.

Thereafter, when the 2nd latch transfer control signal ECCTG shifts to the H level, write data obtained by replacing, of the error corrected data outputted from the error detection/correction circuit 40, only data at the byte positions corresponding to the H-level bits in the write mask signal NWMSK<15:0> with input data DI is held in the 2nd latch node WRD<127:0> of the 2nd latch 60 (To the 2nd latch node, path data from a write input data bus and path data from the error detection/correction circuit 40 are inputted, but the transfer gates 5a and 5b at the corresponding bit positions are not simultaneously brought into a conductive state under the control of the write mask signal NWMSK<15:0>. Accordingly, a situation does not occur where signals inputted to the 2nd latch 60 collide with each other to unstabilize the level of the 2nd latch node WRD<127:0>).

Data in the 2nd latch node WRD<127:0> is inputted to the tri-state element 4a, and also inputted to the parity generation circuit 50 so that the generated parity data is inputted to the tri-state element 4b. Then, when the write buffer control signal WEN shifts to the H level with timing after the generated parity data is determined, the original data and the parity data (128+8 bits) are inputted from the tri-state elements 4a and 4b to the demultiplexers 7a and 7b.

The demultiplexers 7a and 7b transmit the input data and the parity data to the (128+8) global data lines GDL/NGDL<543:0> selected from among the (512+32) global data lines GDL/NGDL<543:0> in response to the column predecode signal AY<3:0>. On the other hand, when the sense amplifier/global data line connection control signal CSLEN shifts to the H level, the multiplexers/demultiplexers 8a and 8b connect the (512+32) global data lines GDL/NGDL<543:0> mentioned above to the (512+32) bit lines selected from among the (1024+64) bit lines in response to the row predecode signal AX<0>. At this time, because the sense amplifier control signal SEN has been enabled, the sense amplifier 20 is in an operating state. However, when the driving ability of each of the tri-state elements 4 has been set larger, the data on the bit lines is replaced with the data outputted from the tri-state elements 4 when the data from the tri-state elements 4 is different from the data on the bit lines so that the data from the tri-state elements 4 is written in the memory cell 10. Of the (128+8)-bit data outputted from the tri-state elements 4, the data at the byte positions corresponding to the L-level bits in the write mask signal NWMSK<15: 0> is originally the data read from the memory cell 10 in the RAS cycle. Therefore, it follows that only the data at the byte positions corresponding to the H-level bits in the write mask signal NWMSK<15:0> is actually overwritten by the input data DI.

When the 1st latch input control signal SWEN shifts to the H level, the (128+8) global data lines GDL/NGDL<543:0> selected from among the foregoing global data lines GDL/NGDL<543:0> in response to the column predecode signal AY<3:0> are connected also to the data amplifiers & 1st latches 30 via the transfer gates 5, and data in the 1st latch nodes RD<543:0> is also updated. Such an update need not particularly be performed in the random write operation, but simpler control is intended in the example of the embodiment by effecting the same control as in a page write/read operation described later. In the case where, e.g., data in the data amplifiers & 1st latches 30 is rewritten with delay timing varied from one bit to another so that the data of the bits selected by the transfer gate 5b in the output of the error detection/correction circuit 40 transiently varies, and data in the second latch 60 may be overwritten, it is necessary to bring the 1st latch data output control signal ROEN or the 2nd latch transfer control signal ECCTG to the L level before a write operation is performed to the data amplifiers & 1st latches 30.

After the serial write sequence is complete, the global data lines and the bit lines are further precharged by a precharge circuit not shown.

Thus, even when the random write operation is performed, it is possible to easily reduce the time required for the CAS cycle in the same manner as in the random read operation.
(Page Write/Read Operation)

Periods t5 to t7 show an example of the page write/read operation. The control unit controls the individual components to perform a RAS operation (RAS cycle) in the period t5 by sensing a shift of the signal NRAS to the L level on a rising edge of the clock (RAS command), perform a write operation in the period t6 in the second clock on sensing the L level of the signal NWE and the L level of the signal NRAS, and perform a read operation and a precharge operation in the period t7 in the third clock on sensing the H level of the signal NWE and the H level of the signal NRAS.

In this case, the write cycle in the periods t5 and t6 is the same as the random write operation in the periods t3 and t4 mentioned above except that the precharge operation is not finally performed. At the time when the write cycle t6 is complete, data is written in the memory cell 10 as described above, and data held by the data amplifiers & 1st latches 30 is updated so that all the data items selected in response to the row predecode signal AX<0> from among respective data items held by the sense amplifiers 20a and 20b coincide with each other. That is, the same state after the RAS cycle (t1) of the normal random read operation is performed is provided.

Accordingly, it is unnecessary to re-transfer data from the sense amplifiers 20 to the data amplifiers & 1st latches 30 unlike in the RAS cycle. In the case of sensing the (page) read cycle in the period t7, the control unit controls the individual components to perform the same operation as in the CAS cycle (t2) of the random read. That is, when the 1st latch data output control signal ROEN shifts to the H level, ¼ of data in the 1st latch nodes RD<543:0> is selected by the multiplexers 6 in response to the column predecode signal AY<3:0>, and inputted to the error detection/correction circuit 40.

Thereafter, when the 2nd latch transfer control signal ECCTG shifts to the H level, the write mask signal NWMSK<15:0> is controlled to the L level during a read cycle so that all the error corrected data is latched by the 2nd latch 60, and outputted to the read output bus DO<127:0>. For example, when a write command is inputted consecutively, the same operation as in the write cycle t4 or t6 is performed.

As described above, even when data read from the memory cell 10 is held by the data amplifiers & 1st latches 30, and then the input data DI is written in the memory cell 10, the data latched by the data amplifiers & 1st latches 30 can be immediately transferred to the subsequent-stage error detection/correction circuit 40 as soon as the column predecode signal AY<3:0> is determined without re-transferring the data in the sense amplifiers 20 to the data amplifiers & 1st latches 30. Therefore, when an ECC process is performed, an increase in CAS latency or an increase in CAS cycle time can be suppressed particularly even during a page operation.

In addition, since it is unnecessary to perform a data transfer from the sense amplifiers 20 to the foregoing data amplifiers & 1st latches 30 each time a CAS access is made, a reduction in power becomes easy.

Further, because random access performance does not deteriorate even when data held by the data amplifiers & 1st latches 30 is updated when data is written in the memory cell 10, it is possible to construct a semiconductor memory device particularly suitable for an embedded DRAM as a unified memory of which a random operation and a high-speed data transfer are both required.

Embodiment 2

Figure 4:
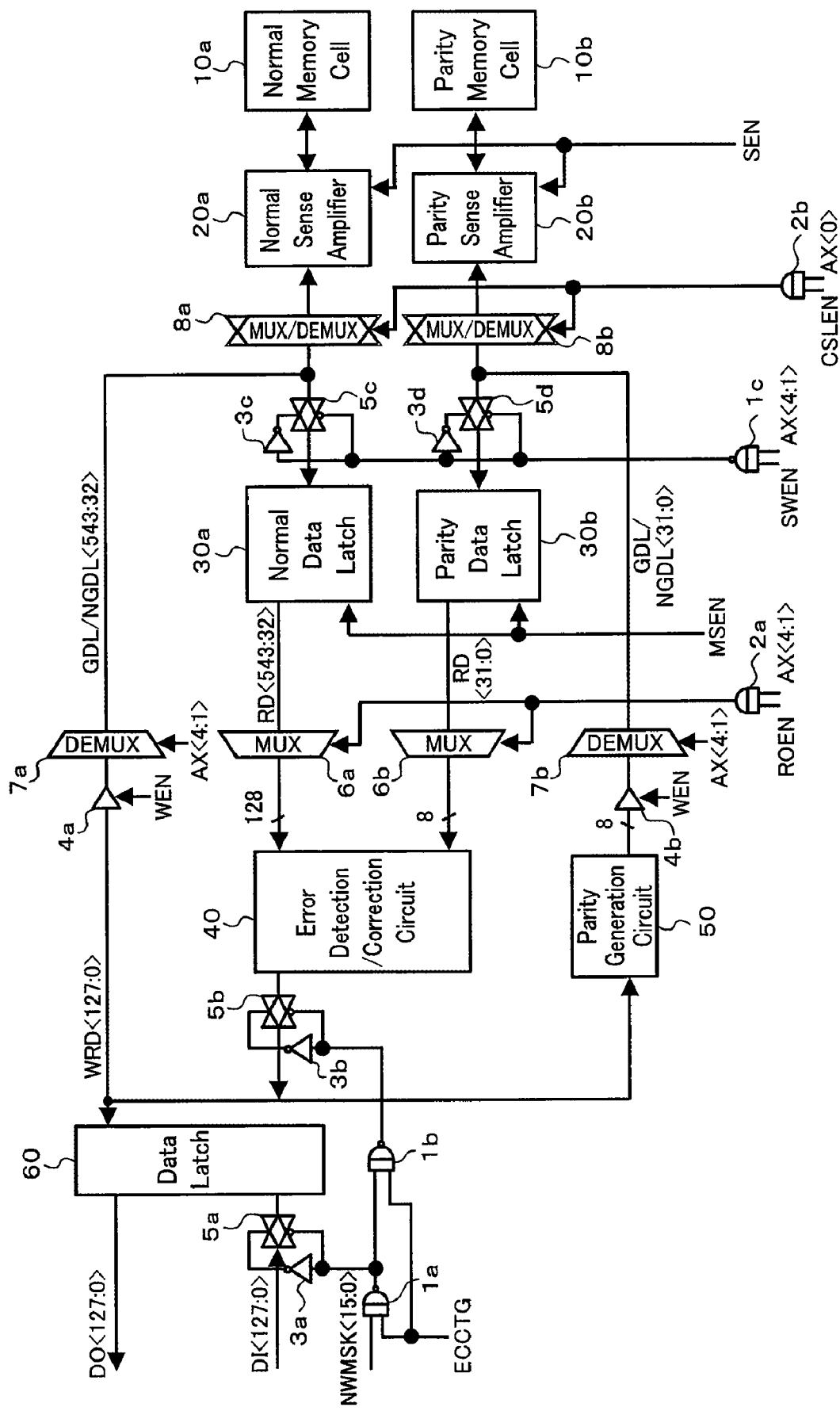
FIG. 4 is a block diagram showing a structure of a principal portion of a semiconductor memory device according to a second embodiment of the present invention.

FIG. 4 shows a structure of a principal portion of a semiconductor memory device according to the second embodiment of the present invention The semiconductor memory device is different from the semiconductor memory device according to the first embodiment in that the transfer gates 5c and 5d, and the multiplexers 6a and 6b are controlled by a row predecode signal AX<4:1>, not by the column predecode signal AY<3:0>.

Figure 5:
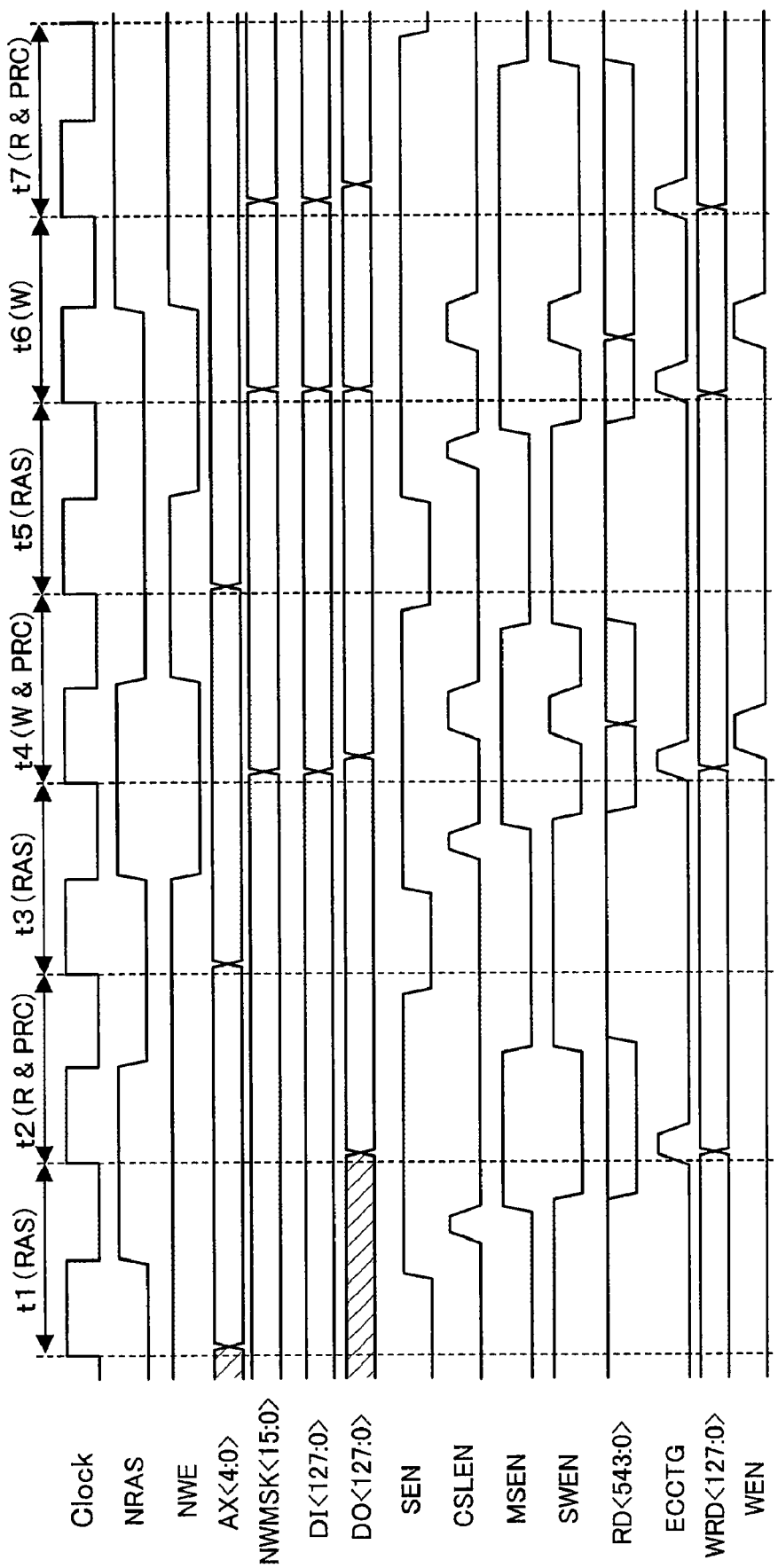
FIG. 5 is a timing diagram showing an operation of the semiconductor memory device according to the second embodiment.

An operation of a circuit thus constructed will be described with reference to a timing diagram of FIG. 5.

Periods t1 and t2 show an example of a random read operation, which is the same as in the first embodiment in that the RAS cycle and the CAS cycle are respectively performed in the periods t1 and t2 based on the signal NRAS and the signal NWE. The sequence from when data read from the memory cell 10 is held by the data amplifiers & 1st latches 30 until the held data is outputted to the 1st latch nodes RD<543:0 > is also the same as in the first embodiment.

However, since the latch data output control signal ROEN is brought to the H level without awaiting the CAS cycle t2, the selection of data in the 1st latch nodes RD<543:0> by the multiplexers 6 is promptly performed in response to the row predecode signal AX<4:1> already determined in the RAS cycle t1. Accordingly, the error detection/correction process by the error detection/correction circuit 40, and the outputting of the read data (error corrected data) to the read output bus DO<127:0> caused by a shift of the 2nd latch transfer control signal ECCTG to the H level are also performed at an early stage. As a result, it is possible to easily reduce the CAS access time or the like.

In addition, the random write operation in the periods t3 and t4, and the RAS operation sequence during the page operation in the periods t5 to t7 are also the same as described above, and an error correction process can be performed without awaiting the CAS cycle even during a write operation. This makes it possible to more easily reduce the CAS cycle or the like.

Embodiment 3

Figure 6:
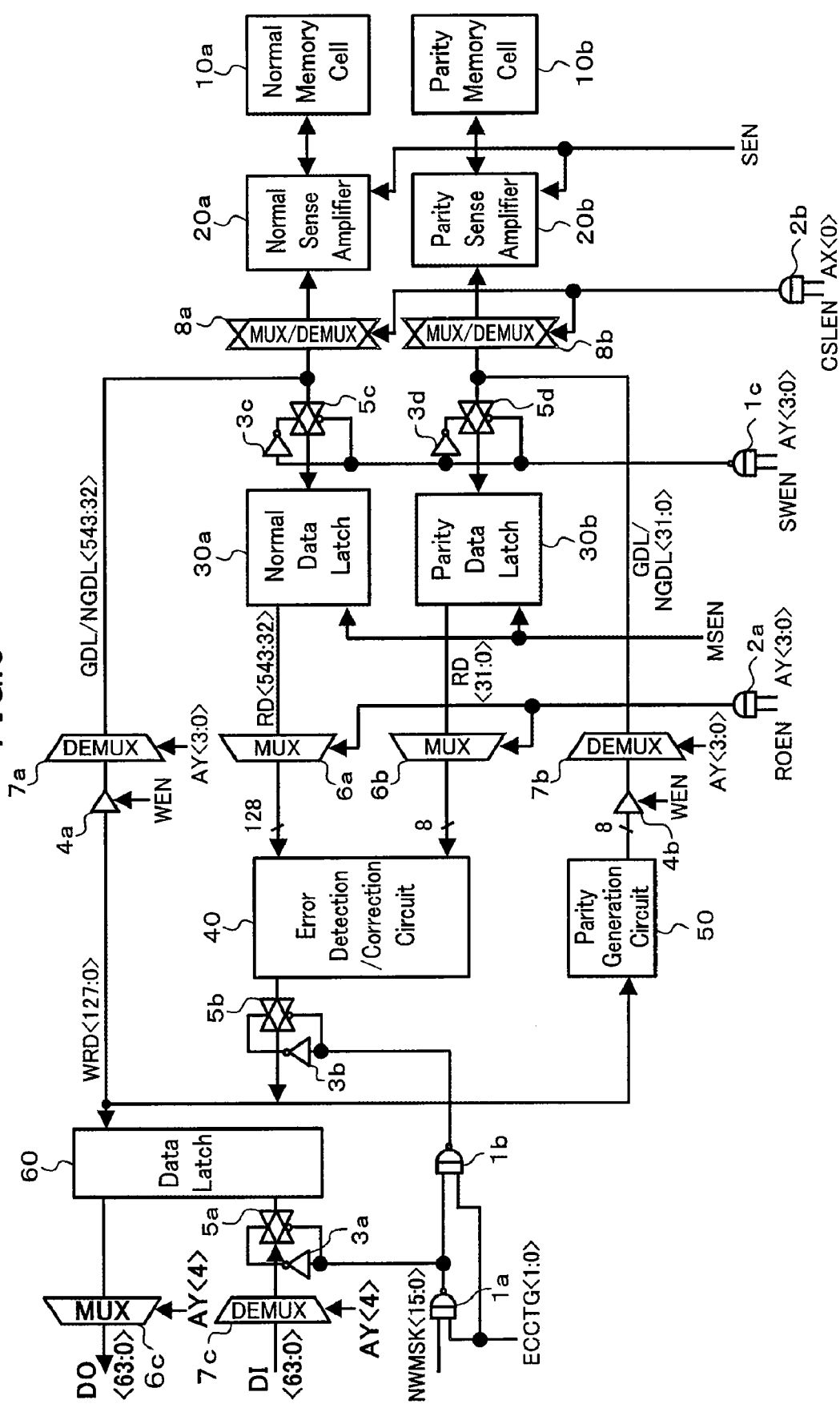
FIG. 6 is a block diagram showing a structure of a principal portion of a semiconductor memory device according to a third embodiment of the present invention.

FIG. 6 shows a structure of a principal portion of a semiconductor memory device according to the third embodiment of the present invention In the semiconductor memory device, a multiplexer 6c and a demultiplexer 7c are each provided in the data input/output unit in addition to the structure of the first embodiment so as to be connected to an external circuit via a 64-bit-width input/output bus.

Instead of the 2nd latch transfer control signal ECCTG, a 2nd latch transfer control signal ECCTG<1:0> according to the 2nd latch transfer control signal ECCTG and the column decode signal AY<4> is used to control the mask of a signal inputted to the 2nd latch 60 in units of 64 bits.

In general, an error detection/correction processing circuit and a parity generation circuit have a trade-off relationship therebetween in which a processing speed is higher, but a layout area increases as the number of input bits is smaller.

For example, when a comparison is made between an error detection/correction processing circuit using a 6-bit parity with respect to 32-bit data and an error detection/correction processing circuit using a 8-bit parity with respect to 128-bit data, the processing speed of the former error detection/correction processing circuit is higher, but the layout area of the latter error detection/correction processing circuit is smaller.

Therefore, by using the multiplexer 6c and the demultiplexer 7c as described above, it is possible to easily vary and differentiate the bus width of data processed in the error detection/correction circuit 40 and the parity generation circuit 50, and the bus width of read/written data inputted and outputted between the semiconductor memory device and the external circuit. This allows the enhancement of flexibility in setting the processing speed and/or the circuit scale.

In addition, by providing the multiplexers 6a and 6b, the demultiplexer 7b, or the multiplexers/demultiplexers 8a and 8b between the memory cell 10 and the error detection/correction circuit 40 or the parity generation circuit 50, the relationship between the number of bits simultaneously read or written from or in the memory cell 10 and the bus width of data processed in the error detection/correction circuit 40 and the parity generation circuit 50 can also be flexibly set. This also allows the enhancement of flexibility in setting the processing speed and/or the circuit scale.

It will easily be understood that the present invention is not limited only to the embodiments described above, and various changes and modifications can be made in the invention without departing from the gist thereof.

For example, the ECC process is not limited to the use of 8-bit parity data with respect to 128-bit normal data. The normal data and the parity data in the ECC process may have other numbers of bits. Also, the numbers of addresses inputted to the multiplexers/demultiplexers 8 are not limited to one bit (½ selection), and may be a plurality of bits. Also, the numbers of the column predecode signals AY<3:0> with respect to the multiplexers 6 or the demultiplexer 7 are not limited to four (¼ selection), and can be variously set. It is further possible to cause only the multiplexers/demultiplexers 8 to make selections. However, as the number of bits in a row address used for the control of the multiplexers/demultiplexers 8 is larger, the circuit scale of the data amplifiers & 1st latches 30 can be reduced, while a range in which an access can be made by varying only the column address in the CAS cycle is narrowed. Accordingly, settings may be appropriately made depending on a required circuit scale or required transfer efficiency.

Alternatively, it is possible to separate the data amplifying function and the data latch function of the data amplifiers & 1st latches 30, and implement the data amplifying function and the data latch function using separate and distinct circuits.

The names of the data amplifiers mentioned above are given for the sake of convenience, and it is also possible to use a buffer having an amplification gain of 1.

The latching function need not necessarily be provided. That is, when the example of the first embodiment (FIG. 1) is modified such that 128-bit data can be obtained only with the multiplexers/demultiplexers 8 by ⅛ selection based on a 3-bit row address, the data (or error corrected data) is all held by the 2nd latch 60. As a result, it is possible to perform a byte-wise data write operation or the like even when the latch function is not provided, unlike in the data amplifiers & 1st latches 30.

It is also possible to use, e.g., a structure in which the RAS cycle is performed in a plurality of clock cycles, or a structure in which a precharge operation is performed in an independent clock cycle.

It is further possible for a plurality of semiconductor memory devices as described above to be contained in one memory macro so that data is inputted and outputted in parallel. Such a structure is suitable for an embedded DRAM having a plurality of data buses.

As described above, it is possible to easily enhance data transfer efficiency by reducing CAS access time or the like.

What is claimed is:

1. A semiconductor memory device comprising:
    a memory cell array from which all bits of a data signal having a first number of the bits composed of a main data signal and an error detection/correction code data signal are simultaneously read;
    a sense amplifier for amplifying the read data signal;
    a selection unit for selecting a data signal having a second number of bits forming a part of the data signal amplified by the sense amplifier; and
    an error detection/correction unit for performing error detection and correction based on at least a part of the selected data signal having the second number of bits;
    an amplification unit for amplifying the data signal having the second number of bits selected by the selection unit; and
    an amplified data signal selection unit for selecting a data signal having a third number of bits forming a part of the amplified signal having the second number of bits, wherein:
    the selection by the selection unit is performed based on a row address, and
    the selection by the amplified data signal selection unit is performed based on either one of the row address and a column address.

2. The semiconductor memory device of claim 1, further comprising:
    a holding unit for holding the data signal before or after the amplification by the amplification unit; or
    a holding unit serving also as the amplification unit.

3. The semiconductor memory device of claim 2, further comprising:
    a switch for cutting off the holding unit and the selection unit.

4. The semiconductor memory device of claim 3, wherein
    a replaced data signal obtained by replacing a part of the corrected data signal from the error detection/correction unit with a part of a data signal inputted from an outside of the semiconductor memory device is written in the memory cell array via the selection unit, and
    the replaced data signal is held by the holding unit via the switch.

5. The semiconductor memory device of claim 4, wherein the data signal outputted from the holding unit is cut off when the replaced data signal is written in the memory cell array.

6. The semiconductor memory device of claim 4, further comprising:
    an input/output data signal holding unit for holding a data signal inputted and outputted between the semiconductor memory device and the outside thereof; and
    a replacement/selection unit for causing the input/output data signal holding unit to selectively hold a part of the corrected data signal and a part of the input data signal inputted from the outside of the semiconductor device.

7. The semiconductor memory device of claim 6, wherein the replacement/selection unit is controlled based on a mask signal indicating the selection of the part of the corrected data signal or the part of the input data signal, and on a hold permission signal indicating permission to hold the selected data signal to the input/output data signal holding unit.

8. The semiconductor memory device of claim 7, wherein the hold permission signal indicates the permission to hold the selected data signal with timing after the corrected data signal is determined.

9. The semiconductor memory device of claim 6, further comprising:
a switching circuit for converting a number of bits of the data signal held by the input/output data signal holding unit.

10. The semiconductor memory device of claim 7, wherein the hold permission signal indicates prohibition of the holding when the data signal held by the input/output signal holding unit is written in the memory cell array.

11. A semiconductor memory device comprising:
a memory cell array from which all bits of a data signal having a first number of the bits composed of a main data signal and an error detection/correction code data signal are simultaneously read;
a sense amplifier for amplifying the read data signal;
a selection unit for selecting a data signal having a second number of bits forming a part of the data signal amplified by the sense amplifier; and
an error detection/correction unit for performing error detection and correction based on at least a part of the selected data signal having the second number of bits;
an amplification unit for amplifying the data signal having the second number of bits selected by the selection unit; and
an amplified data signal selection unit for selecting a data signal having a third number of bits forming a part of the amplified signal having the second number of bits, wherein:
the selection by the selection unit is performed in a RAS cycle, and
the selection by the amplified data signal selection unit is performed in either one of the RAS cycle or a CAS cycle.

12. The semiconductor memory device of claim 11, further comprising:
a holding unit for holding the data signal before or after the amplification by the amplification unit; or
a holding unit serving also as the amplification unit.

13. The semiconductor memory device of claim 12, further comprising:
a switch for cutting off the holding unit and the selection unit.

14. The semiconductor memory device of claim 13, wherein:
a replaced data signal obtained by replacing a part of the corrected data signal from the error detection/correction unit with a part of a data signal inputted from an outside of the semiconductor memory device is written in the memory cell array via the selection unit, and
the replaced data signal is held by the holding unit via the switch.

* * * * *